United States Patent
Kim et al.

(10) Patent No.: US 7,391,260 B2
(45) Date of Patent: Jun. 24, 2008

(54) VARIABLE GAIN AMPLIFIER AND VARIABLE GAIN AMPLIFIER MODULE

(75) Inventors: Young Ho Kim, Daejeon (KR); Mun Yang Park, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 48 days.

(21) Appl. No.: 11/510,403

(22) Filed: Aug. 25, 2006

(65) Prior Publication Data

US 2007/0126501 A1    Jun. 7, 2007

(30) Foreign Application Priority Data

Dec. 6, 2005    (KR) .................. 10-2005-0118073

(51) Int. Cl.
*H03F 1/36* (2006.01)
*H03F 3/45* (2006.01)

(52) U.S. Cl. .................. 330/86; 330/253; 330/260; 330/282

(58) Field of Classification Search .................. 330/60, 330/86, 110, 253, 254, 260, 282, 69
See application file for complete search history.

(56) References Cited

U.S. PATENT DOCUMENTS

| 5,412,346 | A | * | 5/1995 | Burger et al. .................. 330/86 |
| 5,684,431 | A | | 11/1997 | Gilbert et al. .................. 330/254 |
| 6,753,732 | B1 | | 6/2004 | Moreland .................. 330/261 |
| 6,919,760 | B2 | | 7/2005 | Ogita et al. .................. 330/9 |

(Continued)

FOREIGN PATENT DOCUMENTS

JP    2000-13161    1/2000

(Continued)

OTHER PUBLICATIONS

Saito, R., et al. "A 1.8-V 73 dB Dynamic-Range CMOS Variable Gain Amplifier". *Tokyo University of Science*.

*Primary Examiner*—Khanh V Nguyen
(74) *Attorney, Agent, or Firm*—Ladas & Parry LLP (57) ABSTRACT

An analog variable gain amplifier (VGA) adjusting a signal level of a mobile communication system is provided. More particularly, design of a VGA using an operational transconductance amplifier (OTA) having a wide linear input/output range is disclosed. The VGA includes two double-differential-pair OTAs and feedback resistors. A first differential input of a first double differential pair OTA receives an input signal from the forward stage, and a second differential input is negatively fed back through a differential output and a passive resistor. An input in which a first block of the connection structure and first and second differential inputs of a second double differential pair OTA are connected receives an output signal of the first block stage. The output is negatively fed back in series through a variable resistor whose resistance varies exponentially with an adjustment voltage from outside. According to the VGA, it is possible to provide a characteristic of linear variation of gain on a logarithmic scale with respect to a control voltage with a simple and inexpensive constitution. In addition, the VGA can be designed for a low pass filter having a conventional OTA used for a core circuit, and has a simple circuit structure. Therefore, the VGA is convenient for high integration and low-power design, and thus is appropriate for a terminal chip and so forth.

8 Claims, 8 Drawing Sheets

U.S. PATENT DOCUMENTS

| | | | |
|---|---|---|---|
| 7,102,441 B2 * | 9/2006 | Lee et al. | 330/254 |
| 2005/0073362 A1 | 4/2005 | Lin et al. | 330/254 |

FOREIGN PATENT DOCUMENTS

| KR | 10-0410553 | 12/2003 |
|---|---|---|
| KR | 10-0499856 | 6/2005 |
| KR | 10-0499859 | 6/2005 |

* cited by examiner

FIG. 1

PA & DA   MIX   LPF   VGA   DAC

VARIABLE GAIN AMPLIFIER AND VARIABLE GAIN AMPLIFIER MODULE

CROSS-REFERENCE TO RELATED APPLICATION

This application claims priority to and the benefit of Korean Patent Application No. 2005-118073, filed Dec. 6, 2005, the disclosure of which is incorporated herein by reference in its entirety.

BACKGROUND

1. Field of the Invention

The present invention relates to semiconductor circuit technology, and more particularly, to an analog variable gain amplifier (VGA) adjusting a signal level of a mobile communication system, and even more particularly, to design of a VGA employing an operational transconductance amplifier (OTA) having a wide linear input/output range.

2. Discussion of Related Art

Figure 1:
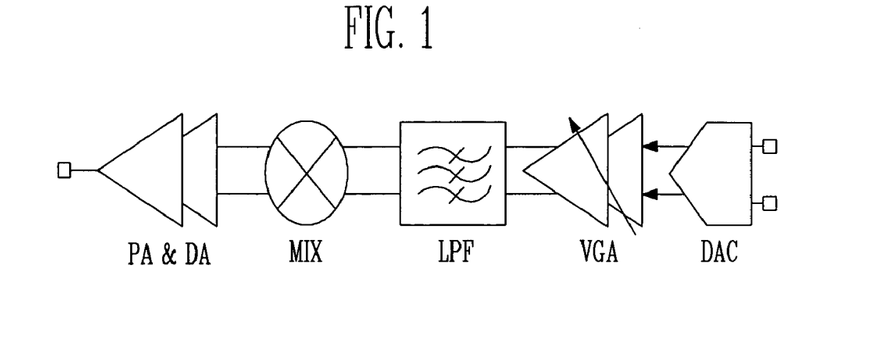
FIG. 1 is a block diagram illustrating a transmission block of a general communication system.

In a mobile communication terminal illustrated in FIG. 1, transmission power of a transmitter should be controlled in order to avoid excessive interference with another terminal. Such power control is performed by an automatic gain control (AGC) circuit, thereby maximizing a dynamic range of the entire system. The core cell of the AGC circuit is nothing but a VGA providing a gain in proportion to a control voltage. AGC circuits are not only used in mobile communication systems but have an extensive range of applications including disk drives, hearing aids, and optical receivers.

The VGA provides a voltage gain that increases exponentially with an AGC signal controlled by a baseband processor (BBP), thereby providing a voltage gain that, in decibels (dB), is linearly proportional to a control voltage. Conventionally, a bipolar junction transistor (BJT) device having an exponential function characteristic has been mainly used for the VGA. However, owing to demand for a complementary metal-oxide-semiconductor (CMOS) system-on-chip (SoC) and development of various circuit technologies, many VGAs having a linear gain characteristic on a logarithmic scale are currently embodied using a CMOS device. However, such CMOS VGAs use many blocks to overcome characteristics of a CMOS device and obtain a linear gain characteristic on a logarithmic scale, which results in a complicated structure and excessive current consumption.

SUMMARY OF THE INVENTION

The present invention is directed to a variable gain amplifier (VGA) having a simple structure and a linear variable gain characteristic on a logarithmic scale.

The present invention is also directed to a circuit structure consuming low power and having a small size to be applied to a core chip of a terminal.

The present invention proposed to achieve the above and other objects is a basic block of a VGA comprising a frequency compensation input unit, a gain amplification unit, and a control unit. In order to broaden a gain adjustment range (dynamic range), a plurality of VGA basic blocks can be arranged into multiple stages to be used.

One aspect of the present invention provides a VGA module comprising a first operational transconductance amplifier (OTA); a first variable resistor connected between a non-inverting input terminal and an inverting output terminal of the first OTA, and having a resistance varying exponentially with an adjustment voltage from outside; a second variable resistor connected between an inverting input terminal and a non-inverting output terminal of the first OTA, and having a resistance varying exponentially with the adjustment voltage from outside; a second OTA connected to the input terminals of the first OTA; a first fixed resistor connected between a non-inverting input terminal and an inverting output terminal of the second OTA; and a second fixed resistor connected between an inverting input terminal and a non-inverting output terminal of the second OTA.

Another aspect of the present invention provides a VGA comprising a differential gain amplifier; a first variable resistor connected between a non-inverting input terminal and an inverting output terminal of the differential gain amplifier, and having a resistance varying exponentially with an adjustment voltage from outside; and a second variable resistor connected between an inverting input terminal and a non-inverting output terminal of the differential gain amplifier, and having a resistance varying exponentially with the adjustment voltage from outside.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS

Hereinafter, an exemplary embodiment of the present invention will be described in detail. However, the present invention is not limited to the exemplary embodiments disclosed below, but can be implemented in various types. Therefore, the present embodiment is provided for complete disclosure of the present invention and to fully inform the scope of the present invention to those ordinarily skilled in the art In general, an operational transconductance amplifier (OTA) having a characteristic of a voltage-current converter has an input/output characteristic that is linear for a considerably wide range, and thus is used in many circuit blocks. In particular, an analog low-frequency filter used in most terminals is designed using such an OTA. Examples of applications of such an OTA are a biquad type filter or an inductor-capacitor (LC) ladder type filter applying a gyrator. In the OTA, a transconductance $G_m$ is stably and minutely controlled by an auto tuning circuit in a system.

When a variable gain amplifier (VGA) is designed using such an OTA, a circuit is stabilized and mixed design with regard to a filter is enabled. Therefore, noise and linearity of the entire system can be adjusted, and a design area can be efficiently reduced through continuous OTA arrangement.

Figure 2A:
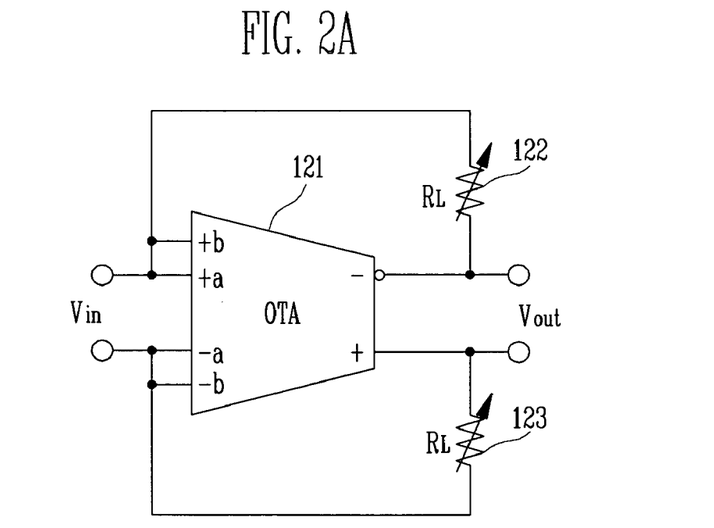
FIG. 2A is a circuit diagram of a gain amplification unit in a variable gain amplifier (VGA) of the present invention.

The basic idea of a VGA according to the above-mentioned technique proposed by the present invention will now be described. As illustrated in FIG. 2A, when an OTA having double differential input pairs has a single differential input structure in which inverting input terminals are connected to each other and non-inverting input terminals are connected to each other, negative feedback is generated through variable resistors $R_L$. In other words, the negative feedback is performed by a first variable resistor 122 connected between the non-inverting input terminals and an inverting output terminal of the OTA, and a second variable resistor 123 connected between the inverting input terminals and a non-inverting output terminal of the OTA. In this case, the structure having a transconductance $G_m$ has a voltage gain defined by Equation 1 given below.

$$G_{dB} = 20\log\left(\left|\frac{Vout}{Vin}\right|\right) = 20\log(|1 - 2R_L G_m|) \quad \text{[Equation 1]}$$

Figure 2B:
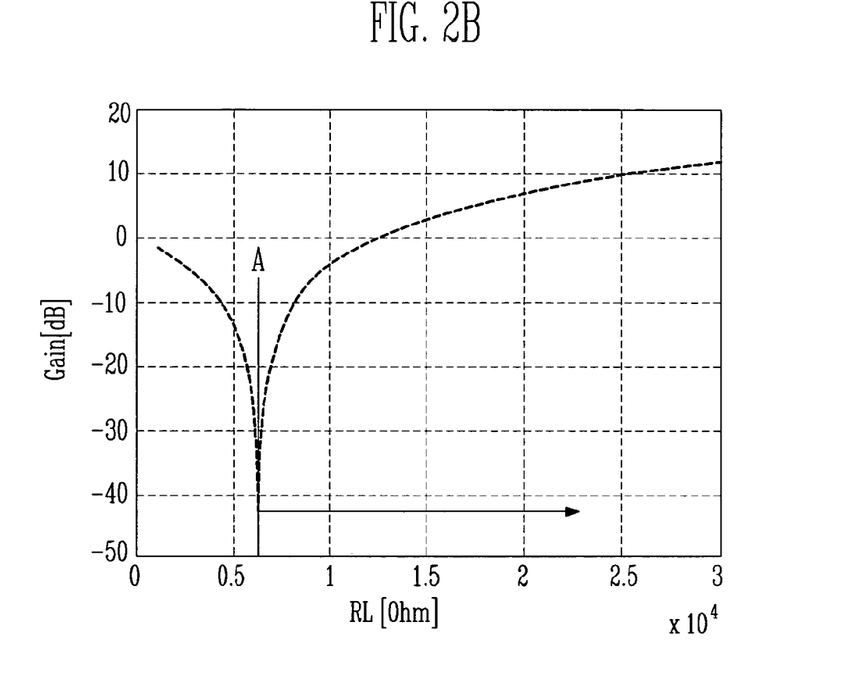
FIG. 2B is a graph of dB gain versus negative feedback resistance $R_L$ of the circuit shown in FIG. 2A.

For example, when the OTA has a transconductance $G_m$ of 80 uA/V with respect to double differential inputs (40 uA/V in the case of a single differential input), the structure of FIG. 2A will show a gain characteristic as illustrated in FIG. 2B. More specifically, the structure simply operates as a buffer having a voltage gain of 1 when a resistance of the variable resistors $R_L$ is 0Ω, shows a characteristic in which a voltage gain decreases in the negative direction until the resistance increases to a value of $1/(2*G_m)$, and shows a gain characteristic in which the voltage gain increases in the positive direction as the phase is inverted when the resistance is more than $1/(2*G_m)$. When the resistance of the variable resistors $R_L$ is controlled to be changed only at or above point A (from 6.25 kΩ to several tens kΩ) in the result shown in FIG. 2, it is possible to obtain a gain variation of 10 dB at about −40 dB. In this case, when the resistance of the variable resistors $R_L$ is linearly changed with respect to an adjustment voltage, a dB gain characteristic will be considerably non-linear. In order to solve this problem, the resistance of the variable resistors $R_L$ must be given by an exponential function of a control voltage VC as shown in Equation 2 given below.

$$\log(2 \cdot Gm \cdot R_L(vc) - 1) \propto A \cdot vc \quad \text{[Equation 2]}$$

Figure 3A:
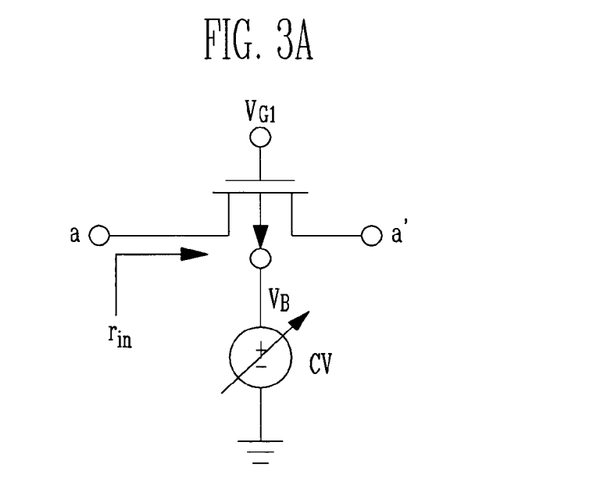
FIG. 3A is a circuit diagram of a metal-oxide-semiconductor (MOS) active resistance device for substituting for the $R_L$ of FIG. 2A.
Figure 3B:
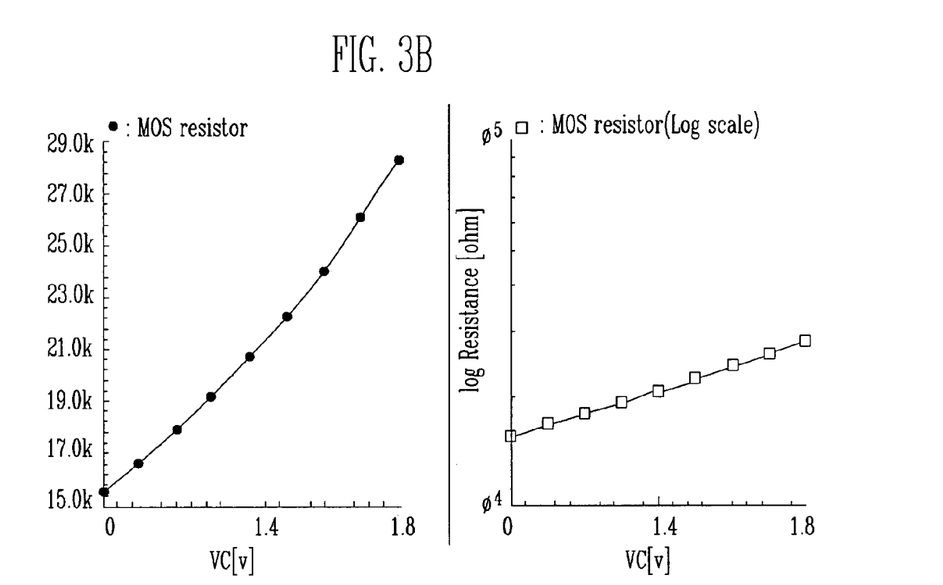
FIG. 3B shows graphs of resistance versus voltage CV of the MOS resistance circuit of FIG. 3A.

The variable resistor $R_L$ of FIG. 2A may be substituted by an active resistor in order to obtain a continuous characteristic as illustrated in FIG. 3A. A p-channel metal-oxide-semiconductor (PMOS) device is used for the active resistor, and its resistance is adjusted by a body voltage. When a gate voltage $V_{G1}$ varies, $|V_{GS}|$ of a triode region MOS resistor connected to an input/output of the OTA becomes less than $|V_{DS}+V_{thp}|$ by a high level input/output signal, and the PMOS device easily enters into a saturation state, thus losing its function as an active resistor. Here, unlike a common MOS resistor, the resistance is not adjusted by the gate voltage $V_{G1}$. Therefore, as the gate voltage $V_{G1}$ increases, a gain adjustment range (dynamic range) decreases. Considering a signal swing range, the gate voltage $V_{G1}$ is set to a value close to ground voltage gnd in order to keep a deep-triode region. More specifically, when $|V_{GS}|-|V_{thp}|>>|V_{DS}|$ and the resistance is adjusted by adjusting the body voltage and VB as defined by Equation 3 given below, it is possible to obtain a simulation result as illustrated in FIG. 3. Referring to the simulation result of FIG. 3B, it can be seen that the logarithm of the resistance of the MOS resistor is linear with respect to the body voltage. Therefore, when $R_{MOS}$ is substituted in Equation 2, a linear characteristic very similar to VC can be obtained.

$$R_{MOS} \approx \frac{1}{\mu_n C_{ox} W / L(V_{GS} - V_{tho} - \gamma(\sqrt{2\Phi_F - V_{SB}} - V_F))} \quad \text{[Equation 3]}$$

Figure 3C:
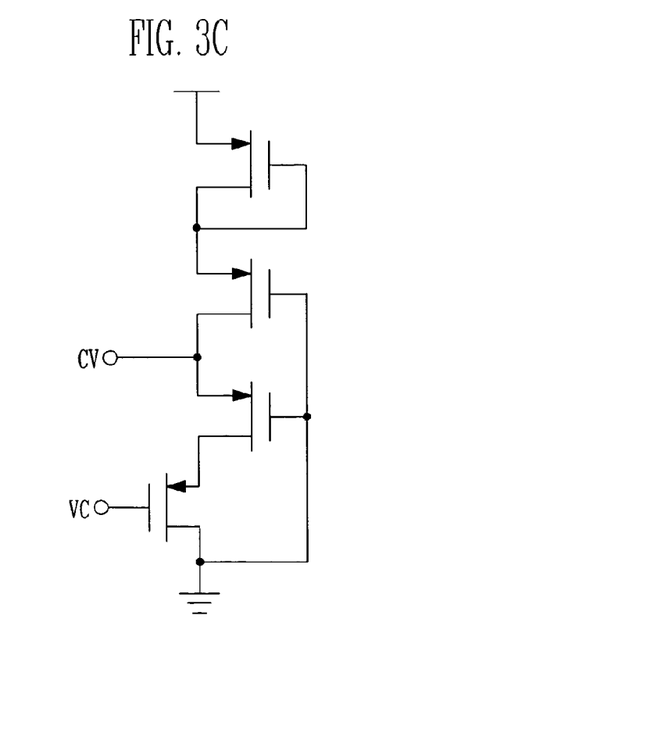
FIG. 3C is a circuit diagram of a circuit generating a voltage CV with respect to a voltage VC in a control unit block.
Figure 3D:
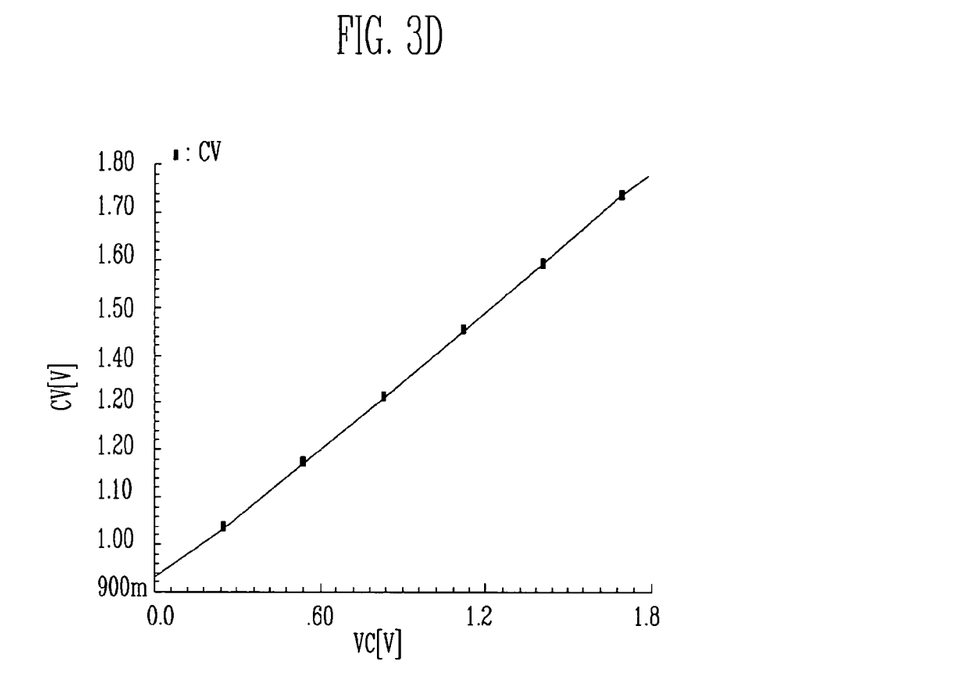
FIG. 3D is a graph showing a characteristic of the CV generating circuit corresponding to the voltage VC of FIG. 3C.

A resistance adjusted by a body adjustment voltage CV is limited to be adjusted only from 1 V to a power voltage Vdd. Therefore, it is preferable to add a dB-linear gain adjustment circuit in a control unit so that the body adjustment voltage CV is adjusted as illustrated in FIGS. 3C and 3D and the resistance can be adjusted within the entire range (from gnd to Vdd), because a wider gain adjustment area can be obtained.

Meanwhile, as illustrated, when the first variable resistor and the second variable resistor are implemented in one MOS transistor, waveform distortion may be caused by excessive drain-source voltage variation. Therefore, in order to prevent variation of the MOS variable resistor caused by the drain-source voltage variation and thus avoid waveform distortion, the first variable resistor and the second variable resistor may be implemented in a structure in which a plurality of MOS transistor resistors are connected in series. In this case, the MOS transistor resistance devices arranged in the illustrated structure are consecutively connected by their sources and drains, and the same voltage is applied to the gates of the MOS transistor resistance devices and also to the bodies.

Due to large signal input, drain-source voltage of MOS resistor is varied. That is, if the amplitude of input signal is more large, MOS variable resistor is varied, whereas the amplitude of input signal is more small, MOS variable resistor isn't varied.

Therefore, in order to prevent above state, the first variable resistor and the second variable resistor may be implemented in a structure in which a plurality of MOS transistor resistors are connected in series. As a result, the MOS transistor doesn't enter into a saturation state and always works in a triode region to avoid waveform distortion.

Figure 4A:
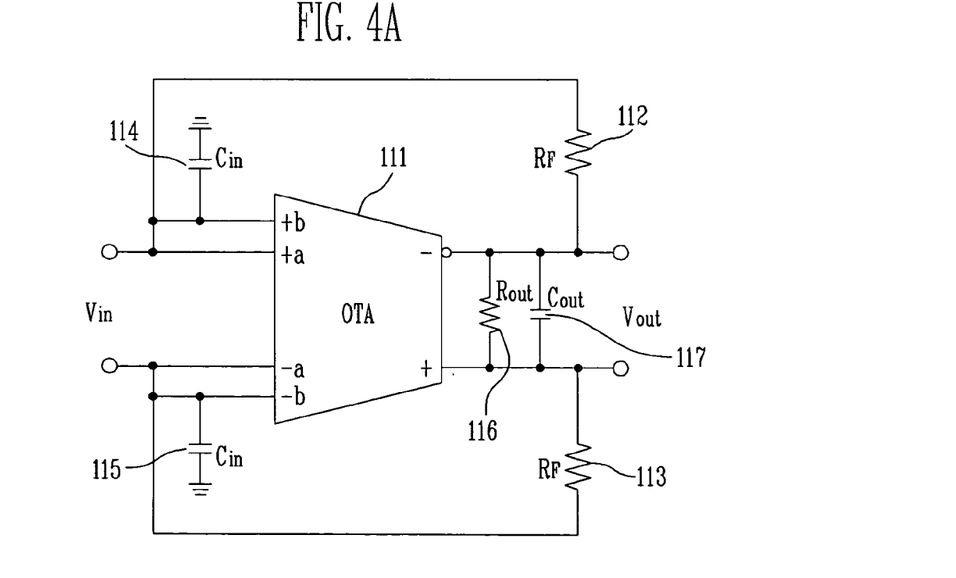
FIG. 4A is a circuit diagram of a frequency compensation input unit in a VGA circuit of the present invention.

FIG. 4A shows a voltage buffer-type high-impedance frequency compensation input unit 110 added for the circuit of FIG. 3A not to be affected by impedance of a forward stage. In addition, the circuit broadens a bandwidth through frequency compensation. The circuit is made up so that two differential inputs among two differential input pairs are directly input at the front side and the other inputs are negatively fed back to outputs through resistors $R_F$. The structure has a characteristic of a quadratic transfer function having two poles and one zero as shown in Equation 4 given below.

$$\frac{V_{out}}{V_{in}} = \frac{1+sR_FC_{in}}{1+\frac{(1+sR_FC_{in})(1+sR_{out}C_{out})}{G_m \cdot R_{out}}} \qquad \text{[Equation 4]}$$

Figure 4B:
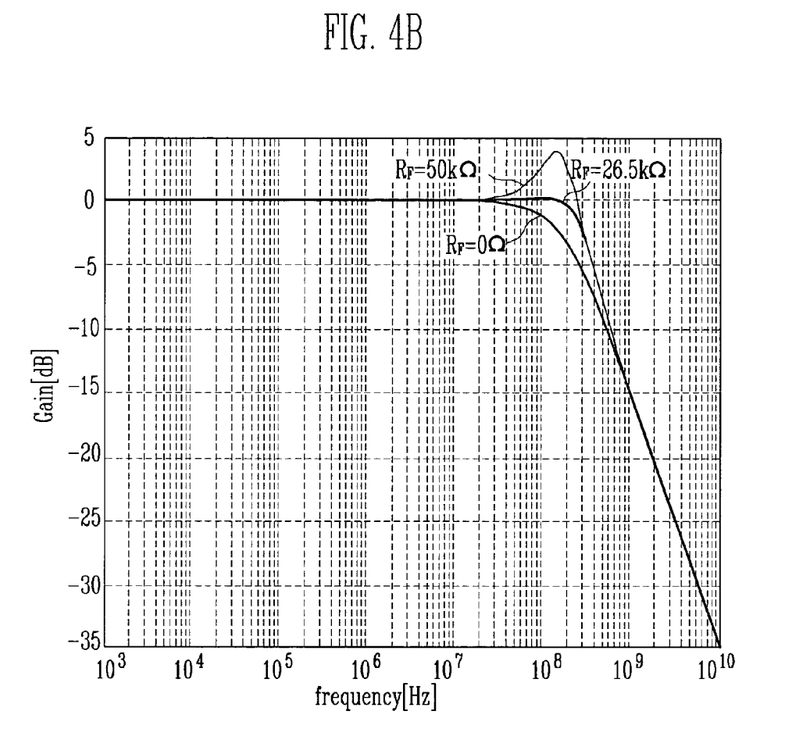
FIG. 4B is a graph showing a frequency characteristic with respect to a resistance $R_F$ of the frequency compensation input unit shown in FIG. 4A.

In Equation 4, $C_{in}$, $C_{out}$ and $R_{out}$ denote a parasitic input capacitor, a parasitic output capacitor, and an output resistance, respectively. Simulation results plotted in FIG. 4B show a transfer function characteristic with respect to each $R_F$ when $G_m$ is 40 uA/V, $C_{in}$ is 150 fF, $C_{out}$ is 220 fF, and $R_{out}$ is 12.8 MΩ. Here, the most uniform and wide bandwidth can be obtained when $R_F$ is 26.5 kΩ.

The frequency compensation input unit 110 is a high-impedance input unit added to block the effect of impedance of the forward stage of a VGA module and to improve a frequency characteristic, and may have the structure shown in FIG. 4A. More specifically, the frequency compensation input unit 110 comprises a second OTA 111 connected to the input terminals of the first OTA, a first fixed resistor 112 connected between a non-inverting input terminal and an inverting output terminal of the second OTA 111, and a second fixed resistor 113 connected between an inverting input terminal and a non-inverting output terminal of the second OTA 111.

Moreover, in order to obtain the poles and the zero of Equation 4, the frequency compensation input unit 110 may further comprise a first input terminal capacitor 114 connected to a feedback non-inverting input terminal of the second OTA 111, a second input terminal capacitor 115 connected to a feedback inverting input terminal, and a parallel capacitor 117 and a parallel resistor 116 connected between the output terminals of the second OTA 111.

Figure 5A:
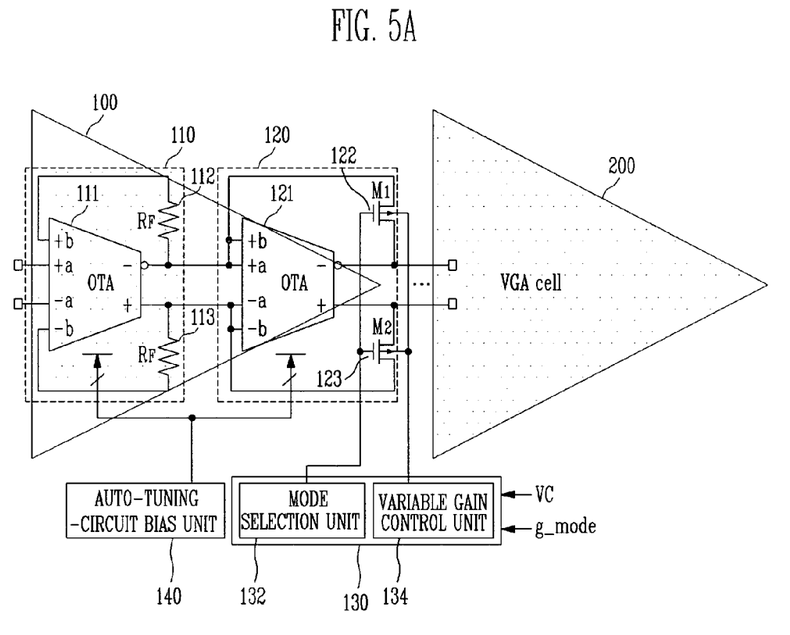
FIG. 5A is a circuit diagram of a VGA module according to an embodiment of the present invention.

FIG. 5A shows a VGA proposed by the present invention. A basic block of the VGA comprises a frequency compensation input unit 110, an amplification unit 120, and a control unit 130.

The control unit 130 is controlled by a control voltage VC from outside, and thus the amplification unit 120 can obtain an exponential voltage gain, i.e., a voltage gain linearly proportional to the control voltage VC in decibels (dB). In addition, a g_mode signal input to the control unit 130 passes through the control unit 130 and controls gate voltages of MOS transistors 122 and 123 for variable resistors in the amplification unit 120. When the gate voltages are changed, resistances of the MOS transistors vary and a starting point according to a body voltage varies, and thus an entire gain range moves. The range is dependent on a used power voltage, an input/output direct current (DC) voltage (common-mode voltage), and a signal level. In order to select a variable gain range of the VGA module, the control unit 130 may include a mode selection unit 132, a variable gain control unit 134, and an auto-tuning-circuit bias unit 140. The control unit 130 generates the mode signal applied to the gates of the MOS transistors 122 and 123. The variable gain control unit 134 generates an adjustment voltage applied to the bodies of the MOS transistors 122 and 123 in order to properly adjust a variable gain of the VGA module within the selected linear variable gain range. The auto-tuning-circuit bias unit 140 controls transconductances $G_m$ of OTAs 111 and 121.

The frequency compensation input unit 110 is a high-impedance input unit added to block the influence of impedance of the forward stage of the VGA module and improve a frequency characteristic.

It is preferable, for convenient implementation and optimized operation, that the OTAs 111 and 121 making up the frequency compensation input unit 110 and the amplification unit 120 are designed according to the same standard, and gain factors $G_m$ of the OTAs 111 and 121 are adjusted by the same auto tuning circuit. In addition, it is more preferable for the OTAs 111 and 121 to be designed according to the same standard as an OTA in another block in an integrated circuit (IC) chip including the VGA module of the present invention, and to be controlled by the same auto tuning circuit.

Figure 5B:
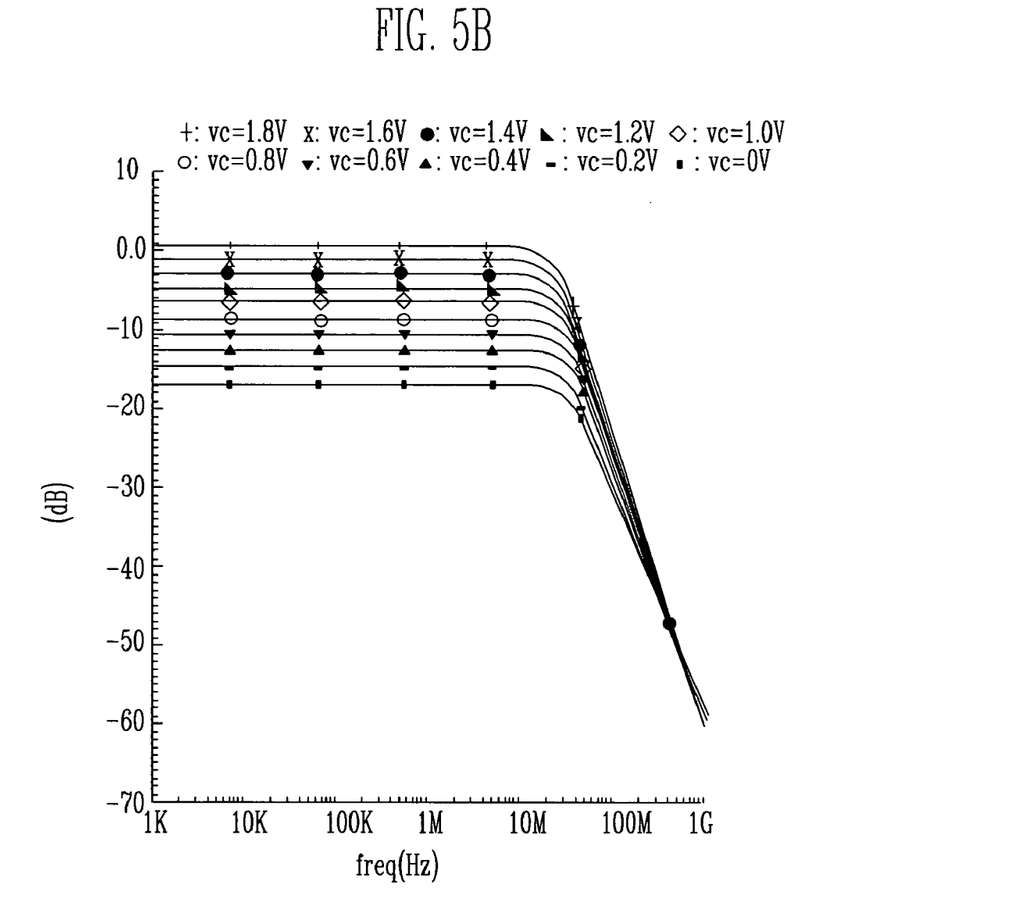
FIG. 5B is a graph showing a gain frequency characteristic with respect to variation of a voltage VC of the VGA module shown in FIG. 5A.
Figure 5C:
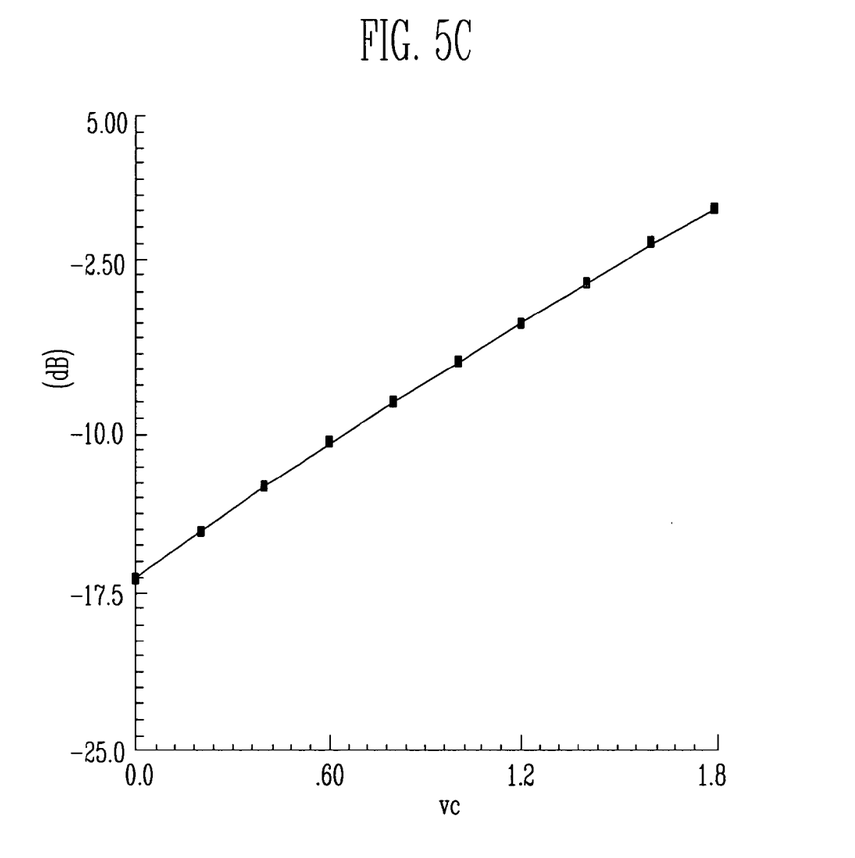
FIG. 5C is a graph showing a dB gain characteristic corresponding to the voltage VC.

FIG. 5B shows a graph of voltage gain versus frequency for different values of a control voltage VC from outside, the frequency characteristic being uniform overall. FIG. 5C is a graph illustrating an in-band voltage gain characteristic corresponding to the control voltage, showing FIG. 5B converted into decibels (dB). It can be seen from the graph that there is a linear relationship between dB gain and the control voltage VC.

According to the VGA of the present invention set forth above, it is possible to provide a simple and inexpensive constitution and a characteristic of linear variation of gain on a logarithmic scale with respect to a control voltage.

In addition, in relation to a filter, the present invention is effective for low power consumption, miniaturization, and/or minute gain control with a simple constitution using a low power consumption OTA.

In addition, the present invention can be designed for a low pass filter in which a conventional OTA is used for a core circuit, and has a simple circuit structure. Therefore, the present invention is convenient for high integration and low-power design, and thus is appropriate for a terminal chip and so forth.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A variable gain amplifier (VGA) comprising:
    a differential gain amplifier;
    a first variable resistor connected between a non-inverting input terminal and an inverting output terminal of the differential gain amplifier, and having a resistance varying exponentially with an adjustment voltage from outside; and
    a second variable resistor connected between an inverting input terminal and a non-inverting output terminal of the differential gain amplifier, and having a resistance varying exponentially with the adjustment voltage from outside,
    wherein each of the first variable resistor and the second variable resistor is a metal-oxide-semiconductor (MOS) transistor having a channel resistance between a source and a drain that varies with the adjustment voltage applied to a body thereof, and
    wherein the MOS transistor has a gate to which a mode signal for selecting a linear variable gain range is applied.

2. The VGA of claim 1, wherein the differential gain amplifier is a double-differential-input-pair operational transconductance amplifier (OTA).

3. The VGA of claim 2, wherein the OTA is designed according to a same standard as another OTA formed in a system including the VGA and receives the same tuning signal.

4. A variable gain amplifier (VGA) module comprising:
    a first operational transconductance amplifier (OTA);

a first variable resistor connected between a non-inverting input terminal and an inverting output terminal of the first OTA, and having a resistance varying exponentially with an adjustment voltage from outside;

a second variable resistor connected between an inverting input terminal and a non-inverting output terminal of the first OTA, and having a resistance varying exponentially with the adjustment voltage from outside;

a second OTA connected to the input terminals of the first OTA;

a first fixed resistor connected between a non-inverting input terminal and an inverting output terminal of the second OTA; and a second fixed resistor connected between an inverting input terminal and a non-inverting output terminal of the second OTA.

5. The VGA module of claim 4, wherein each of the first variable resistor and the second variable resistor is a metal-oxide-semiconductor (MOS) transistor having a channel resistance between a source and a drain that varies with the adjustment voltage applied to a body thereof.

6. The VGA module of claim 5, further comprising:

a mode selection unit for generating a mode signal applied to gates of the MOS transistors in order to select a variable gain range of the VGA module; and a variable gain control unit for generating the adjustment voltage applied to the bodies of the MOS transistors in order to properly adjust a variable gain of the VGA module within the selected linear variable gain range.

7. The VGA module of claim 4, further comprising an auto tuning circuit for adjusting transconductances of the first OTA and the second OTA.

8. The VGA module of claim 4, wherein the first variable resistor and the second variable resistor have a structure in which a plurality of MOS transistor resistors are connected in series.

* * * * *